United States Patent
Yang et al.

(10) Patent No.: US 8,722,309 B2
(45) Date of Patent: May 13, 2014

(54) INFRARED SENSITIVE PHOTOSENSITIVE COMPOSITION AND LITHOGRAPHIC PLATE FABRICATED BY USING SAME

(75) Inventors: Qinghai Yang, Nanyang (CN); Fangqian Teng, Nanyang (CN); Xiaowei Song, Nanyang (CN); Hecheng Li, Nanyang (CN); Zhaoyang Wu, Nanyang (CN); Junjun Wu, Nanyang (CN); Xiaohong Chen, Nanyang (CN); Dongli Liu, Nanyang (CN)

(73) Assignee: Lucky Huaguang Graphics Co., Ltd., Nanyang, Henan (CN)

( * ) Notice: Subject to any disclaimer, the term of this patent is extended or adjusted under 35 U.S.C. 154(b) by 0 days.

(21) Appl. No.: 13/696,802

(22) PCT Filed: Dec. 23, 2011

(86) PCT No.: PCT/CN2011/084553
§ 371 (c)(1),
(2), (4) Date: Nov. 7, 2012

(87) PCT Pub. No.: WO2012/089072
PCT Pub. Date: Jul. 5, 2012

(65) Prior Publication Data
US 2013/0052436 A1     Feb. 28, 2013

(30) Foreign Application Priority Data

Dec. 30, 2010   (CN) .......................... 2010 1 0614939

(51) Int. Cl.
| | | |
|---|---|---|
| *B41N 1/00* | (2006.01) | |
| *G03F 7/00* | (2006.01) | |
| *G03F 7/26* | (2006.01) | |
| *B41M 5/00* | (2006.01) | |

(52) U.S. Cl.
USPC ................. 430/270.1; 430/271.1; 430/278.1; 430/281.1; 430/284.1; 430/302; 101/453; 101/463.1

(58) Field of Classification Search
USPC .......... 430/270.1, 302; 101/450.1, 453, 463.1
See application file for complete search history.

(56) References Cited

U.S. PATENT DOCUMENTS

| | | | | |
|---|---|---|---|---|
| 6,387,595 | B1 * | 5/2002 | Teng ............................. | 430/302 |
| 2003/0226463 | A1 * | 12/2003 | Teng .......................... | 101/463.1 |
| 2009/0233235 | A1 * | 9/2009 | Williamson et al. .......... | 430/302 |

FOREIGN PATENT DOCUMENTS

| | | | |
|---|---|---|---|
| CN | 101192004 | A1 * | 6/2008 |
| JP | 2011152711 | A * | 8/2011 |

OTHER PUBLICATIONS

Machine translation of JP 2011152711 A.*

* cited by examiner

*Primary Examiner* — Chanceity Robinson
(74) *Attorney, Agent, or Firm* — Raymond Y. Chan; David and Raymond Patent Firm

(57) ABSTRACT

An infrared sensitive and chemical treatment free photosensitive composition, includes, based on weight percentage, 30-70% of a water soluble thermally cross-linking resin, 1-20% of a water-soluble photocross-linking polymerized resin, 10-50% of a photopolymerizable oligomer, 1-30% of a multifunctional monomer, 1-20% of a cationic photopolymerization initiator, and 1-20% of an infrared irradiation absorption dye. The photosensitive composition of the present invention is useful for preparation of an infrared sensitive and chemical treatment free lithographic plate. The lithographic plate of the present invention has a high sensitivity and a good mesh point reduction, and after exposure to an infrared light source, can be printed directly after being washed with tapped water or without any washing and processing step, and has a long run length.

24 Claims, No Drawings

INFRARED SENSITIVE PHOTOSENSITIVE COMPOSITION AND LITHOGRAPHIC PLATE FABRICATED BY USING SAME

BACKGROUND OF THE INVENTION

1. Field of the Invention

The present invention relates to lithographic plate imaging, and more particularly to an infrared sensitive photosensitive composition being used to preparation of a lithographic plate which is processed by chemical free developer and a method of preparation of a lithographic plate utilizing the photosensitive composition thereof.

2. Description of Related Arts

The conventional method of preparation of lithography plate is commonly known in the printing industry. There are at least two steps in the process of making the lithographic plate. First, a plate with light sensitive composition is exposed to a particular light source through a mask (such as a positive or a negative mask film) through which a latent image is formed. Second, a subsequent development of the plate after exposure is processed through which excessive coating is removed. A presensitized lithographic plate is a plate which utilizes aluminum or polyester as the support and is prepared through the above two steps to obtain a surface which has both lipophilic and hydrophilic properties for lithographic printing. In general, in a negative-type system, because of the occurrence of polymerization or cross-linking of the coating in the portion under exposure, it becomes insoluble or very difficult to dissolve in the developer and therefore the coating in the portion which is not exposed can be removed during the process of development. Conversely, in a positive-type system, the material in the exposed portion of the plate is removed during the process of development. In general, the process of development includes the step of washing and developing with developer in a treatment unit with developer is used for development. The developer used for positive lithographic plate is a strong base while the developer used for negative lithographic plate is a mixture of strong base and organic solvent such as benzyl alcohol. It is noted that heating method or other methods are also used for image development. The drawback of the above mentioned development process (that is, wet and heat) is time consuming and high cost. In addition, when volatile organic solvent or strong alkaline is used as the developer, treatment of these liquid waste will cause environment problems.

With the development of digital printing, the technological development of plate material, namely CTP, also developed at a fast pace. This technology utilizes software programming to control an on/off status of a laser probe of a CTP platesetter device, then the image to be printed in digitalized format is sent to a presensitized lithographic plate directly and is prepared into the lithographic plate for printing through the above 'development process'. CTP technology realizes the digitalization of flat plate preparation and eliminates the need of preparation of master film. Admittedly, CTP is a breakthrough in lithography. However, 'development process' is still required in this CTP plate preparation and therefore there is still production of liquid waste which causes environmental problems.

In view of the sewage and environmental issues, the researchers in this industry has proposed a variety of solutions which are basically summarized as the three approaches as follows:

The first approach makes use of the phase change technology through sensitive coating to change the lipophilic/hydrophilic properties of the presensitized surface which is then installed onto the printing device directly. In this approach, the lipophilic and hydrophilic properties are solely realized by the light sensitive coating and no excessive coating is removed from the plate such that no pollutants is released from the process of plate preparation through printing and therefore the object of environmental protection is achieved. However, the drawbacks are high energy requirement for plate preparation, instability of ink balance and low run length. Therefore the result is not satisfactory.

Another approach is a type of 'processed in the machine' of which the principle is: the presensitized plate is scanned through CTP plate device in which excessive coating in the blank portion for printing is removed through the effect of dampening water and ink and is carried away by the printing paper. The blank portion is hydrophilic aluminum support and this approach achieves the object of zero pollutant emission for environmental protection. However, in view of the published patent application paper, the drawbacks includes dirty on the blank portion, poor run length or ink unbalance difficult to control during the printing process.

Another approach is after the presensitized plate is scanned through CTP plate device, a particular type of 'non-base or non-solvent' solvent is used to pretreat the plate to remove the excessive coating in the blank portion before installing onto the printing device for printing. This approach is similar to 'wet development' process but the 'pretreatment solution' does not have chemicals of base composition or solvent when compared to the developer and the principle of removing the excessive coating in the blank portion is different. The first is a physical process involving dissolution and diffusion while the second is a chemical reaction involving dissolution and diffusion. Therefore, this method is also referred to as 'non-chemical treatment' technology. The advantage of this approach is that a more environmental friendly discharge is resulted while a dot correction, which is applicable in conventional CTP plate, is also possible before installing onto the printing device for printing such that getting bad printing plate is avoided. However, this approach also has some drawbacks as follows: the pretreatment solution is not pure water but water which includes chemicals such as dampening agent, diffusing agent or gum Arabic. Therefore, this approach is not truly environmental friendly.

SUMMARY OF THE INVENTION

An object of the present invention is to solve the above problems in conventional technology in that it provides infrared sensitive photosensitive composition and a method of preparation of a lithographic plate utilizing the photosensitive composition thereof. The lithographic plate which is prepared by using the photosensitive composition of the present invention is first processed by infrared laser scanning exposure such that water can be used to wash away the excessive coating on a blank portion of the lithographic plate, and the lithographic plate can be used directly to install onto a printing device for printing without any washing step. The lithographic plate prepared by the photosensitive composition of the present invention overcome the drawbacks of the lithographic plate of conventional arts as described above and realize a truly environmental friendly emission result. In addition, during the preparation of the lithographic plate, the power consumption is low, the dot reproduction is good and the run length is long.

Additional advantages and features of the invention will become apparent from the description which follows, and may be realized by means of the instrumentalities and combinations particular point out in the appended claims.

According to the present invention, the foregoing and other objects and advantages are attained by infrared sensitive photosensitive composition by percentage weight, comprising: 30-70% water soluble thermal cross-linking resin; 1-20% water soluble photo cross-linking/polymeric resin; 10-50% photopolymerizable oligomer; 1-30% multifunctional monomer; 1-20% cationic photopolymerization initiator; and 1-20% infrared irradiation absorption dye.

Preferably, the composition by percentage weight comprises: 40-60% water soluble thermal cross-linking resin; 5-10% water soluble photo cross-linking or polymeric resin; 20-40% photopolymerizable oligomer; 10-20% multifunctional monomer; 5-15% cationic photopolymerization initiator; and 5-15% infrared irradiation absorption dye.

The water soluble thermal cross-linking resin is urethanized and unsaturated vinyl multi-component co-polymer A having the following chemical structure:

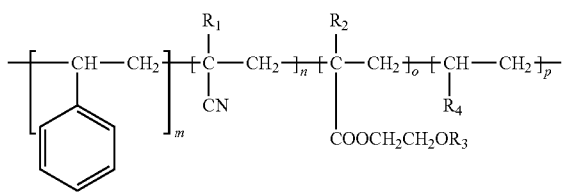

where R1 and R2 are hydrogen or methyl, R3 is $CH_2=C(CH_3)COOCH_2CH_2NCO$-group, R4 is amide group, polyethoxylated ether group or pyrrolidone; m, n, o, p is number of mole of the corresponding co-polymer unit; a molar ratio of m is 40~70%, a molar ratio of n is 10~30%, a molar ratio of o is 10~30%, a molar ratio of p is 10~30%.

The water soluble photo cross-linking/polymeric resin is sulfonic acid group containing unsaturated and water soluble co-polymer B having the following chemical structure:

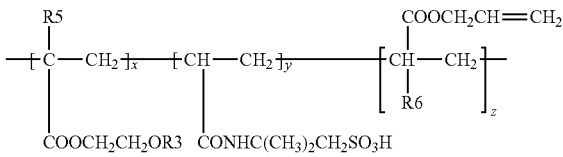

where R5 and R5 are hydrogen or methyl, x, y, z is number of mole of co-polymer unit; a molar ratio of x is 20~40%, a molar ratio of y is 10~30% and a molar ratio of z is 30~50%.

Preferably, the photopolymerizable oligomer is polyurethane acrylic oligomer.

Preferably, the multifunctional monomer is selected from acrylic monomer, polyurethane acrylic monomer or epoxy acrylate monomer.

Preferably, the cationic photopolymerization initiator is selected from one or more of the group consisting of: iodonium salt, sulfur salt, phosphorus salt and selenium salt.

Preferably, the thermal decomposition temperature of said cationic photopolymerization initiator is 150~200° C.

Preferably, the infrared irradiation absorption dye is a water soluble cyanine dye having an absorption range of 750~850 nm.

In accordance with another aspect of the invention, the present invention comprises a lithographic plate prepared by using Infrared sensitive photosensitive composition, comprising: (1) aluminum substrate support unit; (2) a hydrophilic layer containing the above mentioned unsaturated and water soluble co-polymer B provided on the aluminum substrate support unit; (3) a coating layer of Infrared sensitive photosensitive composition on top of the hydrophilic layer provided on the same side of the aluminum substrate support unit as the hydrophilic layer; and (4) a protective layer on top of the coating layer of Infrared sensitive photosensitive composition provided on the same side of the aluminum substrate support unit as the hydrophilic layer.

The aluminum substrate support unit is an aluminum substrate which is first processed by electrolytic roughening and anodizing and then follows by sealing treatment, wherein an average of the centerline roughness is 0.4-0.6 μm.

The dry weight of the hydrophilic layer is 0.5-10 mg/dm², the dry weight of the coating layer of Infrared sensitive photosensitive composition is 8-15 mg/dm², and the dry weight of the protective layer is 5-20 mg/dm².

According to the preferred embodiment of the present invention, the lithographic plate which is processed by scanning and exposure with a thermal CTP platesetter can eliminate the need of development by developer and utilize tap water at 15-30° C. for washing to obtain a printable lithographic plate.

According to the preferred embodiment of the present invention, the lithographic plate which is processed by scanning and exposure with a thermal CTP platesetter can be put on press for printing directly without any photographic processing steps.

The lithographic plate preparation method and the photosensitive composition according to the preferred embodiment of the present invention has the advantageous effect of providing a lithographic plate with high sensitivity and good mesh point reduction while the lithographic plate can be directly put on press for printing without any photographic processing steps or can be washed with tap water directly after scanning and exposure with infrared light source.

In the multi-component co-polymer A of the present invention, the styrene unit has good thermoplastic property and a desirable glass transition temperature. Accordingly, the co-polymer A can be used as adhesives which exhibit heating to melting property such that the text or graphic in the heated portion can be firmly bonded with the substrate and therefore dramatically increase the ink receptivity of the text and graphic portion. The content of styrene unit in the multi-component co-polymer affect the glass transition temperature and thermoplastic property of the polymer directly. According to the present invention, the styrene co-polymer unit A has a weight percentage of 40-70% before grafting to the multi-component co-polymer unit. Preferably, the weight percentage of the styrene co-polymer unit is 50-60%.

In the multi-component co-polymer A of the present invention, the (methyl) acrylonitrile unit can be selected from cyanoacrylate ester, ethyl cyanoacrylate, acrylonitrile or methylacrylonitrile. Preferably, the (methyl) acrylonitrile unit is acrylonitrile, methylacrylonitrile or a mixture of acrylonitrile and methylacrylonitrile. During the synthesis of the multi-component co-polymer of the present invention, a weight percentage of the (methyl) acrylonitrile unit B before grafting is 10-30%, and preferably 15-25%.

The multi-component co-polymer A of the present invention includes an urethanized, unsaturated, double bonded and branched co-polymer unit in which its unsaturated lipid group crosslink with the multifunctional oligomer under the light or heating to form a three dimensional crosslink structure such that the coating can be changed from hydrophilic to hydrophobic and the printing process can be realized. The existence of urethane bonding with strong polarity in the adhesive provides a very strong absorption effect on the aluminum substrate and increase the run length of the plate. On the other hand, the polyurethane in the adhesive provides better compatibility with the polyurethane oligomer, therefore the black dot problems which is caused by differences in solubility of different units is less likely to occur.

The urethanized, unsaturated, double bonded and branched co-polymer unit of the multi-component co-polymer of the present invention has a mole percentage of 10-30%, and preferably 15-25%.

The multi-component co-polymer A of the present invention includes a vinyl copolymer unit which has a branched chain hydrophilic group. Preferably, the hydrophilic group is selected from the group consisting of an amide group, a phosphoric acid group, a pyrrolidone group and an ether group. Preferably, the hydrophilic group is selected from an amide group, a pyrrolidone group and an ether group (including polyethoxyethyl group) or a mixture thereof. For examples, the hydrophilic group is selected from acryloyl morpholine, methoxy polyethylene glycol acrylate and N-vinyl pyrrolidone. If the co-polymer unit is a branched and water-soluble unit containing a polyethoxyethyl group, the molecular weight of the polyethoxyethyl group cannot be too great or the polymerization of the main chain will be affected. Conversely, if the molecular weight is too small, the water solubility will be adversely affected. The effective molecular weight is 400-100000, and preferably 1000-50000. The optimal molecular weight is 1500-20000.

The vinyl copolymer unit which has a branched chain hydrophilic group of the multi-component co-polymer of the present invention has a mole percentage of 10-30%, and preferably 15-25%.

The multi-component co-polymer A of the present invention has an average molecular weight of 5000-200000, preferably 15000-1000. The optimal average molecular weight is 40000-80000. The glass transition temperature is 30-260° C., preferably 40-150° C., and most preferably 60-130° C.

Some examples of the multi-component co-polymer A is illustrated as follows (which is not intended to be limiting):

A1:

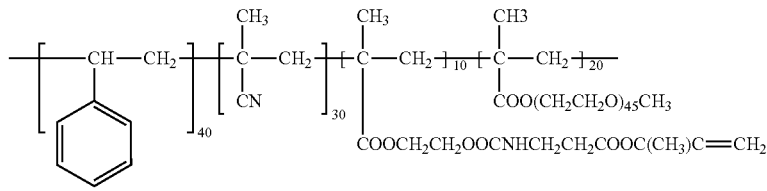

A2:

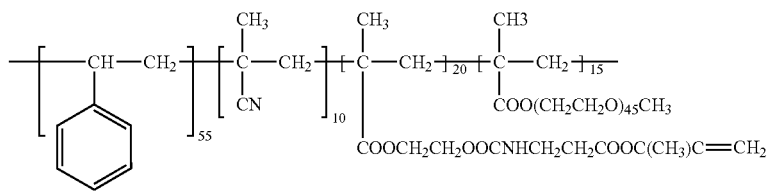

A3:

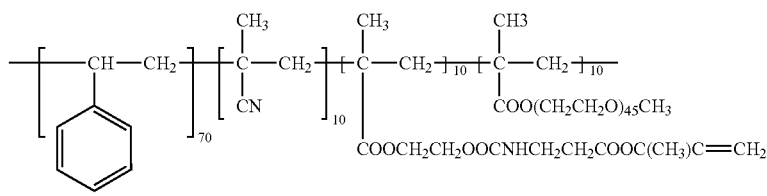

A4:

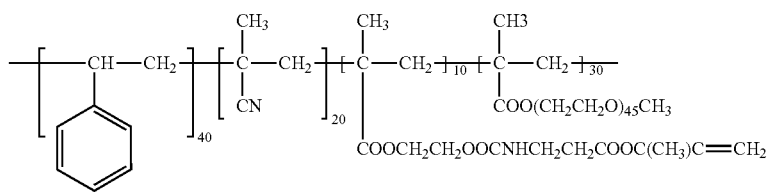

A5:

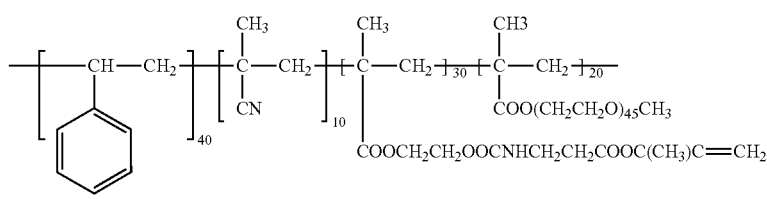

A6:
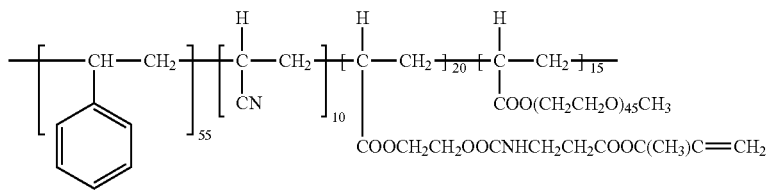

A7:
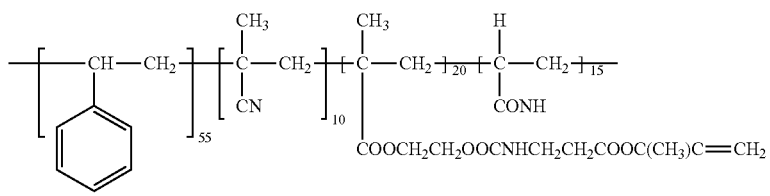

A8:
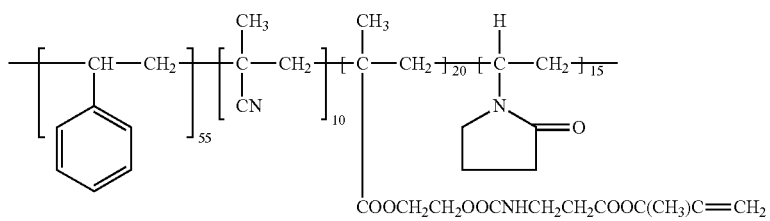

In the multi-component co-polymer B of the present invention, the unsaturated and water-soluble co-polymer unit contains a sulfonic acid group and any composition containing unsaturated alkenes group and sulfonic acid group can be used. The unsaturated alkenes group ensures the polymerization with other unit and the sulfonic acid group ensures the water solubility property. The co-polymer unit with sulfonic acid group can be selected from vinyl sulfonic acid, styrene sulfonic acid, 2-hydroxy-3-allyloxy-1-propyl sulfonic acid, allyloxybenzenesulfonic acid, 2-acrylamido-2-methyl propyl sulfonic acid and isoprene sulfonic acid. The molar ratio of the co-polymer unit with sulfonic acid group in the entire co-polymer is 10~30%, and preferably 15~25%.

In the unsaturated and water-soluble multi-component co-polymer B of the present invention, an unsaturated, double bond and branched propylene or a methacrylate co-polymer unit is provided in which the unsaturated, double bond and branched structure is obtained by grafting acrylic acid or methacrylate to GMA monomer and then grafting unsaturated and double bond alkenes to the GMA. The unsaturated alkenes monomer being used for grafting can be selected from acryloyl chloride, methacryloyl chloride, isocyanate and isocyanate group ethyl methyl acrylate. The molar ratio of the co-polymer unit in the entire co-polymer is 20~40%, and preferably 25~30%.

The unsaturated and water-soluble multi-component co-polymer B of the present invention contains acrylate or methacrylate co-polymer unit which has an unsaturated and double bond in a substitute group and is selected from acrylate, β-hydroxyethyl acrylate, methyl acrylate, β hydroxyethyl acrylate, and hydroxymethyl methacrylate. The monomer which can be used for grafting is selected from acryloyl chloride, methacryloyl chloride, allyl isocyanate, and an isocyanate group ethyl methyl acrylate. The molar ratio of the co-polymer unit in the entire co-polymer is 30~50%, and preferably 35~45%.

Some examples of the multi-component co-polymer B is illustrated as follows (which is not intended to be limiting):

B1:
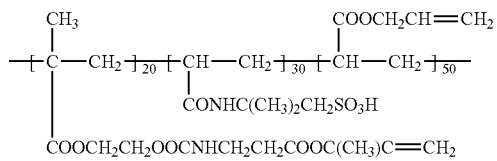

B2:
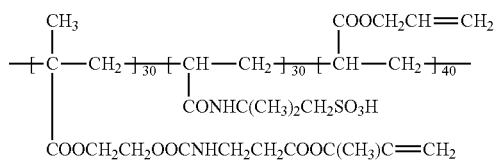

B3:
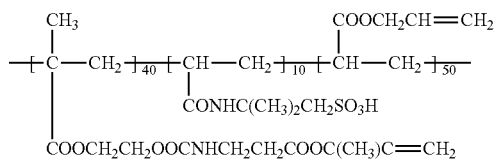

B4:
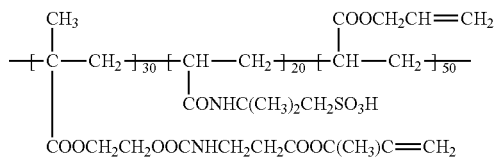

B5:

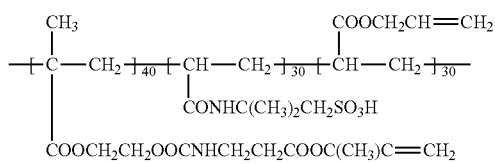

B6:

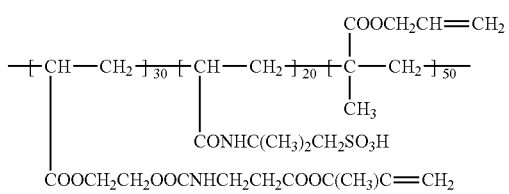

According to the present invention, the photopolymerizable oligomer can utilize different type of oligomer such as polyester-based acrylic esters, epoxy acrylates, urethane acrylates, polyether acrylates, silicone oligomer, and etc. Preferably, the oligomer is urethane acrylates oligomer. The dry weight of the oligomer in the photosensitive coating layer is 10~50%, and preferably 20~40%.

According to the present invention, the photopolymerizable monomer can utilize different type of monomer such as: single function monomer which contains (Meth) acrylic acid esters such as ethyl acrylate, butyl acrylate, allyl methacrylate, and etc; multifunctional monomer which contains diacrylate, 1,6-hexanediol diacrylate, pentaerythritol triacrylate and tetraacrylate, 1,3,5-3-(2-acryloyloxyethyl)iso-cyanurate, hydroxypropylmethylglyceryl triacrylate, the hydroxyethyl trimethylolpropyl triacrylate, polyethylene glycol dimethacrylate, acrylic acid ester, etc; isocyanate monomer which contains 2-isocyanate-methyl ethyl acrylate and dimethyl-m-isopropenyl benzyl isocyanate ester, and etc. Preferably, multifunctional monomer is selected. The dry weight of the multifunctional monomer in the photosensitive coating layer is 1~30%, and preferably 10~20%.

According to the present invention, the cationic photopolymerization initiator is an onium salt such as sulfonium salt and iodonium salt. Suitable salt includes sulfonium salt, oxyalkylene onium salt, oxathiolane salt, sulfoxide-onium salts, diazonium salts and halonium salt such as iodonium salt. In particular, examples of the suitable salt includes chlorinated diphenyl iodonium salt, diphenyliodonium hexafluorophosphate, diphenyliodonium hexafluoroantimonate, 4-[(2-hydroxy-tetradecyl-oxy)phenyl]phenyl iodonium hexafluoroantimonate, triphenylsulfonium tetrafluoroborate iodonium salts, triphenyl sulfonium octyl sulfate iodonium salt, hexafluorophosphate-2-methoxy-4-aminophenyl diazonium salt, hexafluoroantimonate phenoxy phenyldiazo. The dry weight of the cationic photopolymerization initiator in the photosensitive coating layer is 1~20%, and preferably 5~15%.

According to the present invention, the infrared irradiation absorption dye is selected from azo dyes, triarylamine dyes, indol gun dyes, oxonol dyes, cyanine dyes, merocyanine dyes, indocyanine dyes, phthalocyanine dyes, polythiophene dyes, pyrazoline azo dyes, oxazine dyes, naphthoquinone dyes, anthraquinone dyes, quinoneimine dyes, methine dyes, porphyrin dyes. Preferably, dyes with maximum absorption wavelength of 780~850 nm are selected so as to facilitate the utilization of existing major infrared laser platesetter in the market for scanning and exposure. The dry weight of the infrared irradiation absorption dye in the photosensitive coating layer is 1~20%, and preferably 5β-15%.

According to the present invention, a suitable chemical composition for coloring which includes a pigment, a dye or a dye system can be used. In order to produce a viewable image after exposure, a pigment, a dye or a dye system can be used. Suitable chemicals or systems can produce color and luster change under the effect of radiation exposure or under the effect of contact with exposed substance of light initiator. The suitable composition or system includes (but not limited to) acyl-protected thiazine, diazine and oxazine, dimerized water molecules (such as Michler dimerization of water molecules), indolene and triaryl methyl lactones (e.g., Crystal Violet Lactone). The composition for coloring has a predetermined quantity which is sufficient for illustrating the contrast between the exposed and non-exposed portion of the plate of the present invention. The dry weight of the composition for coloring in the coating layer is 0.05~5% (by weight).

In addition, the photosensitive coating layer can include different materials which combines with the essential elements of the present invention. For example, dye, organic or inorganic grain, sensitized dyes, plasticizers, binders, surface active agents, antioxidants, coating aids, anti-stabilizers, waxes, UV or visible light absorbers and brighteners can be used without affect the functioning of the present invention.

According to the present invention, the substrate for lithographic printing which is prepared by infrared irradiation absorption dye is an aluminum substrate processed by electrolytic roughening, anodizing and sealing treatment, wherein an average thickness of the centerline is 0.4~0.6 μm, preferably 0.3~0.5 μm. This plate can be prepared and obtained through different types of electrolytic roughening. According to the present invention, the aluminum substrate is a highly pure aluminum plate in which the content of aluminum is preferably 99%. Suitable aluminum substrate (but not intend to be limiting) is: 0.1%~0.5% iron, 0.03%~0.3% silicon, 0.003%~0.03% copper, 0.01%~0.1% titanium. The electrolyte used for electrolytic roughening can be acid, base, salt solution, or a solution containing organic solvent. Preferably, the electrolyte is selected from hydrochloric acid, nitric acid or salt solution of hydrochloric acid or nitric acid. First, the aluminum plate is immersed in a solution of 1~30% sodium hydroxide, potassium hydroxide, sodium carbonate, sodium silicate and is processed by chemical corrosion under 20~80° C. for 5~250 seconds. Then, neutralize with 10~30% nitric acid or sulfuric acid under 20~70° C. to remove gray matter. The aluminum plate processed by the above cleaning process is then processed through electrolysis for 10~300 seconds under 10~60° C., positive and negative alternative charge of rectangular, platform or sinusoidal wave, current density of 5~100 A/dm² with nitric acid or hydrochloric acid as the electrolyte. Then the aluminum which is processed through electrolysis is arranged for anodizing treatment. Anodizing treatment usually employs sulfate process in which the concentration of sulfuric acid is 5~30%, the current density is 1~15 A/dm², the temperature is 10~60° C., the time is 5~250 seconds for forming 1~10 g/m² oxide film. The oxide film formed through the above method has higher level microporous oxide film which has higher adsorption ability and is easier to adhere unwanted substances. Accordingly, further sealing treatment is required. Sealing treatment can be achieved by different methods. Preferably, 50%~80% of the micro pores of the oxide film is sealed.

The photosensitive composition of the present invention can uses conventional method of coating (such as Knife coating, blade coating, bar coating, roll coating, extrusion coating and etc.) to coated onto the substrate support. Dissolve a predetermined amount of photosensitive materials of the present invention in solvent and/or water to form a coating solution. Suitable coating solution includes: Ethylene glycol diethyl ether, ethylene glycol monomethyl ether, propylene glycol monomethyl ether, propylene glycol methyl ether acetate, diethylene glycol monomethyl ether, methyl lactate, ethyl lactate, methyl ethyl ketone, methanol, ethanol, isopropanol, 1-methoxy-2-propanol and etc. One or more of the coating solution can be used for the present invention.

Before applying the coating of the photosensitive materials, the unsaturated and water-soluble multi-component co-polymer B is applied to the substrate after sealing treatment. Conventional method of coating such as Knife coating, blade coating, bar coating, roll coating, extrusion coating, slit extrusion coating can be used to coat the composition onto the substrate support. Before coating, the co-polymer B is dissolved in water to prepare into a predetermined concentration, or is prepared according to a preset parameters with the addition of one or more coating auxiliary agent. Preferably, the dry weight of the coating for hydrophilic treatment is 0.5~10 mg/dm$^2$. If the dry weight is less than 0.5 mg/dm$^2$, then the result cannot be achieved. If the dry weight is greater than 10 mg/dm$^2$, the bonding between the coating and the substrate will be decreased and the problem of falling off may be easily resulted.

After the coating of Infrared sensitive photosensitive composition, a protective layer is coated on top of the photosensitive composition layer. The protective layer can prevent the image formation reaction caused by exposure in the photosensitive composition layer. Low molecular weight components such as oxygen and alkaline substances under the atmospheric condition can mix with the photosensitive coating layer and cause the exposure of the photosensitive coating layer in the atmospheric condition. Accordingly, the protective layer has specific requirement in which the low molecular weight components such as oxygen has low penetration to the protective layer. Also, the protective layer will not affect the light penetration to the photosensitive layer during exposure and has good adhesiveness with the photosensitive layer. In addition, the protective layer is easily removed during development processing. On the other hand, the protective layer can also have other properties or serves other functions. For example, colorant (such as water soluble dye) which is added during exposure and has good light penetration effect at 780-850 nm, and can effective absorb light outside the range of 780-850 nm can be used. Accordingly, without causing any decrease in light sensitivity, the safety of lithographical printing under the white light is increased.

The materials used for the protective layer, for example, is preferably selected from high molecular weight components which is water soluble and has good crystallization ability. In particular, the materials can be selected from water soluble polymer such as polyvinyl alcohol, polyvinyl pyrrolidone, acidic cellulose-based substance, gelatin, gum Arabic and polyacrylic acid. In the above polymer, when polyvinyl alcohol is used as the major component, an optimal result in relation to oxygen-blocking properties and removal effect during development is achieved. The polyvinyl alcohol used in the protective layer includes non-substitute vinyl alcohol monomer for providing oxygen-blocking and water solubility properties in which a portion can be substituted by ester, ether and acetal. On the other hand, another portion can include other polymer components. In particular, when the polyvinyl alcohol is used, the example being used can be a composition which has 70~100% hydrolysis ability and has a molecular weight of 300~2400. In particular, the examples are: PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-217E, PVA-220E, PVA-224E, PVA-405, PVA-420, PVA-613 and etc.

In addition to the consideration of oxygen-blocking and removal properties, fog and adhesion properties, and scratch resistance are also important properties for the selection of composition and quantity of the protective layer (the choice of PVA and additives). In general, if the PVA has higher hydrolysis ability (which is high content of non-substituted vinyl alcohol in the protective layer) and greater thickness, the oxygen-blocking ability is higher with advantageous effect on photosensitivity. On the other hand, adhesion properties and scratch resistance are very important in image printing. That is to say, when the hydrophilic layer formed by water soluble polymer composition is pressed on top of the lipophilic layer, insufficient adhesiveness may be resulted and the coating may fall off. The portion at which the coating fell off will has defect of film solidification caused by anti-polymerization effect of oxygen. The dry weight of the protective layer is 5~20 mg/dm$^2$, and preferably 10~15 mg/dm$^2$.

Still further objects and advantages will become apparent from a consideration of the ensuing description and drawings.

These and other objectives, features, and advantages of the present invention will become apparent from the following detailed description, the accompanying drawings, and the appended claims.

DETAILED DESCRIPTION OF THE PREFERRED EMBODIMENT

The present invention is further described in details by the following exemplary embodiments which are not intended to be limiting.

Exemplary Embodiment 1

Substrate preparation: provide a roll of aluminum plate of A1050 having a purity of 99.5% and a thickness of 0.3 mm; immerse in an aqueous solution of 5% sodium hydroxide at 70° C. for 20 seconds; after washing under running water, immediately neutralize with an aqueous solution of 1% nitric acid; then process electrolytic roughening for 16 seconds in 1% hydrochloric acid solution under 40° C. with AC sine wave with a current density of 50 A/dm$^2$; then neutralize for 10 seconds with 5% sodium hydroxide; rinse with water; process anodizing for 20 seconds in 20% sulfuric acid solution under 30° C. with a current density of 15 A/dm$^2$; rinse with water; process sealing treatment for 18 seconds in 5% sodium silicate solution under 80° C.; rinse with water; and dry to obtain the substrate which has an average centerline roughness of 0.5 μm and a mass of the oxide film is 3.0 g/m$^2$.

Hydrophilic treatment: Obtaining the substrate prepared from above method; coating an aqueous solution of 0.1% water soluble resin; drying for 20 seconds at 100° C.; and obtaining a coating layer having a dry weight of 5 mg/dm$^2$.

The coating of Infrared sensitive photosensitive composition: applying a photosensitive solution to the substrate after hydrophilic treatment by extrusion coating and drying for 60 seconds at 100° C. to obtain a coating layer having a dry weight of 10 mg/dm$^2$. The photosensitive solution has the following composition (part by weight);

polymer having a chemical structure A1: 3.518
polymer having a chemical structure B1: 0.72
urethane acrylate oligomer: 0.36
pentaerythritol triacrylate: 0.684 sulfonium hexafluorophosphate salt: 0.72
infrared absorption dye D1: 0.036
BYK-333: 0.004
1-methoxy-2-propanol: 32.40

The coating of protective layer: applying a protective layer solution to the substrate after the above coating of Infrared sensitive photosensitive composition by extrusion coating and drying for 60 seconds at 110° C. to obtain a coating layer having a dry weight of 10 mg/dm².

The polymer having a chemical structure A1 is a DMF solvent (30.7% by percentage weight, which is the same as A2, A3, A4, A5, A6, A7 and A8 in the comparative examples and the following exemplary embodiment);

The infrared absorption dye has a chemical structure as follows:

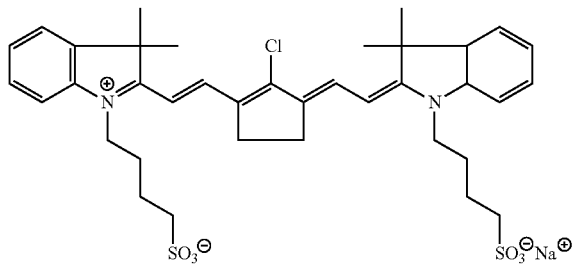

The lithographic plate obtained from this embodiment can be processed by using KODAK trendsetter thermal CTP platesetter for exposure at 120 mJ/cm², and then loading for printing after washing with tap water for 30~50 seconds without any additional chemicals at 25-30° C. with a MASTER VIEW developing machine. Alternatively, the lithographic plate can also be loaded for printing directly without washing with tap water. The functional performance is listed in Table 1.

Exemplary Embodiment 2

The substrate, the hydrophilic layer, the photosensitive layer and the protective layer are prepared by the same method as exemplary embodiment 1. The photosensitive solution has the following composition (part by weight);
    polymer having a chemical structure A2: 5.635
    polymer having a chemical structure B2: 0.360
    urethane acrylate oligomer: 1.080
    pentaerythritol triacrylate: 0.036
    sulfonium hexafluorophosphate salt: 0.36
    infrared absorption dye D1: 0.036
    BYK-333: 0.004
    1-methoxy-2-propanol: 32.40

The lithographic plate obtained from this embodiment can be processed by using KODAK trendsetter thermal CTP platesetter for exposure at 100 mJ/cm², and then loading for printing after washing with tap water for 30~50 seconds without any additional chemicals at 25-30° C. with a MASTER VIEW developing machine. Alternatively, the lithographic plate can also be loaded for printing directly without washing with tap water. The functional performance is listed in Table 1.

Exemplary Embodiment 3

The substrate, the hydrophilic layer, the photosensitive layer and the protective layer are prepared by the same method as described above. The photosensitive solution has the following composition (part by weight);
    polymer having a chemical structure A3: 8.208
    polymer having a chemical structure B1: 0.036
    urethane acrylate oligomer: 0.360
    pentaerythritol triacrylate: 0.288
    sulfonium hexafluorophosphate salt: 0.036
    infrared absorption dye D1: 0.360
    BYK-333: 0.004
    1-methoxy-2-propanol: 32.40

The lithographic plate obtained from this embodiment can be processed by using KODAK trendsetter thermal CTP platesetter for exposure at 140 mJ/cm², and then loading for printing after washing with tap water for 30~50 seconds without any additional chemicals at 25-30° C. with a MASTER VIEW developing machine. Alternatively, the lithographic plate can also be loaded for printing directly without washing with tap water. The functional performance is listed in Table 1.

Exemplary Embodiment 4

The substrate, the hydrophilic layer, the photosensitive layer and the protective layer are prepared by the same method as described above. The photosensitive solution has the following composition (part by weight);
    polymer having a chemical structure A4: 3.518
    polymer having a chemical structure B3: 0.072
    urethane acrylate oligomer: 1.800
    pentaerythritol triacrylate: 0.180
    sulfonium hexafluorophosphate salt: 0.180
    infrared absorption dye D1: 0.288
    BYK-333: 0.004
    1-methoxy-2-propanol: 32.40

The lithographic plate obtained from this embodiment can be processed by using KODAK trendsetter thermal CTP platesetter for exposure at 90 mJ/cm², and then loading for printing after washing with tap water for 30~50 seconds without any additional chemicals at 25-30° C. with a MASTER VIEW developing machine. Alternatively, the lithographic plate can also be loaded for printing directly without washing with tap water. The functional performance is listed in Table 1.

Exemplary Embodiment 6

The substrate, the hydrophilic layer, the photosensitive layer and the protective layer are prepared by the same method as described above. The photosensitive solution has the following composition (part by weight);
    polymer having a chemical structure A5: 3.518
    polymer having a chemical structure B1: 0.324
    urethane acrylate oligomer: 0.360
    pentaerythritol triacrylate: 1.080
    sulfonium hexafluorophosphate salt: 0.036
    infrared absorption dye D1: 0.720
    BYK-333: 0.004
    1-methoxy-2-propanol: 32.40

The lithographic plate obtained from this embodiment can be processed by using KODAK trendsetter thermal CTP platesetter for exposure at 130 mJ/cm², and then loading for printing after washing with tap water for 30~50 seconds without any additional chemicals at 25-30° C. with a MASTER VIEW developing machine. Alternatively, the lithographic plate can also be loaded for printing directly without washing with tap water. The functional performance is listed in Table 1.

Exemplary Embodiment 6

The substrate, the hydrophilic layer, the photosensitive layer and the protective layer are prepared by the same method as described above. The photosensitive solution has the following composition (part by weight);
    polymer having a chemical structure A6: 5.277
    polymer having a chemical structure B4: 0.540
    urethane acrylate oligomer: 0.360 pentaerythritol triacrylate: 0.360
sulfonium hexafluorophosphate salt: 0.360
infrared absorption dye D1: 0.360
BYK-333: 0.004
1-methoxy-2-propanol: 32.40

The lithographic plate obtained from this embodiment can be processed by using KODAK trendsetter thermal CTP platesetter for exposure at 120 mJ/cm$^2$, and then loading for printing after washing with tap water for 30~50 seconds without any additional chemicals at 25-30° C. with a MASTER VIEW developing machine. Alternatively, the lithographic plate can also be loaded for printing directly without washing with tap water. The functional performance is listed in Table 1.

Exemplary Embodiment 7

The substrate, the hydrophilic layer, the photosensitive layer and the protective layer are prepared by the same method as described above except that the average roughness of centerline of the substrate is 0.4 μm.

The lithographic plate obtained from this embodiment can be processed by using KODAK trendsetter thermal CTP platesetter for exposure at 120 mJ/cm$^2$, and then loading for printing after washing with tap water for 30~50 seconds without any additional chemicals at 25-30° C. with a MASTER VIEW developing machine. Alternatively, the lithographic plate can also be loaded for printing directly without washing with tap water. The functional performance is listed in Table 1.

Exemplary Embodiment 8

The substrate, the hydrophilic layer, the photosensitive layer and the protective layer are prepared by the same method as described above except that the average roughness of centerline of the substrate is 0.6 μm.

The lithographic plate obtained from this embodiment can be processed by using KODAK trendsetter thermal CTP platesetter for exposure at 120 mJ/cm$^2$, and then loading for printing after washing with tap water for 30~50 seconds without any additional chemicals at 25-30° C. with a MASTER VIEW developing machine. Alternatively, the lithographic plate can also be loaded for printing directly without washing with tap water. The functional performance is listed in Table 1.

Exemplary Embodiment 9

The substrate, the hydrophilic layer, the photosensitive layer and the protective layer are prepared by the same method as exemplary embodiment 1, except that the dry weight of the hydrophilic layer is 0.5 mg/dm$^2$. The photosensitive solution has the following composition;
    polymer having a chemical structure A1: 3.518
    polymer having a chemical structure B5: 0.72
    urethane acrylate oligomer: 0.36
    pentaerythritol triacrylate: 0.684
    sulfonium hexafluorophosphate salt: 0.72
    infrared absorption dye D1: 0.036
    BYK-333: 0.004
    1-methoxy-2-propanol: 32.40

The lithographic plate obtained from this embodiment can be processed by using KODAK trendsetter thermal CTP platesetter for exposure at 120 mJ/cm$^2$, and then loading for printing after washing with tap water for 30~50 seconds without any additional chemicals at 25-30° C. with a MASTER VIEW developing machine. Alternatively, the lithographic plate can also be loaded for printing directly without washing with tap water. The functional performance is listed in Table 1.

Exemplary Embodiment 10

The substrate, the hydrophilic layer, the photosensitive layer and the protective layer are prepared by the same method as exemplary embodiment 1, except that the dry weight of the hydrophilic layer is 10 mg/dm$^2$. The photosensitive solution has the following composition;
    polymer having a chemical structure A1: 3.518
    polymer having a chemical structure B6: 0.72
    urethane acrylate oligomer: 0.36
    pentaerythritol triacrylate: 0.684
    sulfonium hexafluorophosphate salt: 0.72
    infrared absorption dye D1: 0.036
    BYK-333: 0.004
    1-methoxy-2-propanol: 32.40

The lithographic plate obtained from this embodiment can be processed by using KODAK trendsetter thermal CTP platesetter for exposure at 120 mJ/cm$^2$, and then loading for printing after washing with tap water for 30~50 seconds without any additional chemicals at 25-30° C. with a MASTER VIEW developing machine. Alternatively, the lithographic plate can also be loaded for printing directly without washing with tap water. The functional performance is listed in Table 1.

Exemplary Embodiment 11

The substrate, the hydrophilic layer, the photosensitive layer and the protective layer are prepared by the same method as exemplary embodiment 1, except that the dry weight of the photosensitive layer is 8 mg/dm$^2$.

The lithographic plate obtained from this embodiment can be processed by using KODAK trendsetter thermal CTP platesetter for exposure at 120 mJ/cm$^2$, and then loading for printing after washing with tap water for 30~50 seconds without any additional chemicals at 25-30° C. with a MASTER VIEW developing machine.

Alternatively, the lithographic plate can also be loaded for printing directly without washing with tap water. The functional performance is listed in Table 1.

Exemplary Embodiment 12

The substrate, the hydrophilic layer, the photosensitive layer and the protective layer are prepared by the same method as exemplary embodiment 1, except that the dry weight of the photosensitive layer is 15 mg/dm$^2$.

The lithographic plate obtained from this embodiment can be processed by using KODAK trendsetter thermal CTP platesetter for exposure at 120 mJ/cm$^2$, and then loading for printing after washing with tap water for 30~50 seconds without any additional chemicals at 25-30° C. with a MASTER VIEW developing machine. Alternatively, the lithographic plate can also be loaded for printing directly without washing with tap water. The functional performance is listed in Table 1.

Exemplary Embodiment 13

The substrate, the hydrophilic layer, the photosensitive layer and the protective layer are prepared by the same method as exemplary embodiment 1, except that the dry weight of the protective layer is 5 mg/dm$^2$. The photosensitive solution has the following composition;
    polymer having a chemical structure A7: 3.518
    polymer having a chemical structure B1: 0.72
    urethane acrylate oligomer: 0.36
    pentaerythritol triacrylate: 0.684
    sulfonium hexafluorophosphate salt: 0.72
    infrared absorption dye D1: 0.036
    BYK-333: 0.004
    1-methoxy-2-propanol: 32.40

The lithographic plate obtained from this embodiment can be processed by using KODAK trendsetter thermal CTP platesetter for exposure at 120 mJ/cm², and then loading for printing after washing with tap water for 30~50 seconds without any additional chemicals at 25-30° C. with a MASTER VIEW developing machine. Alternatively, the lithographic plate can also be loaded for printing directly without washing with tap water. The functional performance is listed in Table 1.

Exemplary Embodiment 14

The substrate, the hydrophilic layer, the photosensitive layer and the protective layer are prepared by the same method as exemplary embodiment 1, except that the dry weight of the protective layer is 20 mg/dm². The photosensitive solution has the following composition;
  polymer having a chemical structure A8: 3.518
  polymer having a chemical structure B1: 0.72
  urethane acrylate oligomer: 0.36
  pentaerythritol triacrylate: 0.684
  sulfonium hexafluorophosphate salt: 0.72
  infrared absorption dye D1: 0.036
  BYK-333: 0.004
  1-methoxy-2-propanol: 32.40

The lithographic plate obtained from this embodiment can be processed by using KODAK trendsetter thermal CTP platesetter for exposure at 100 mJ/cm², and then loading for printing after washing with tap water for 30~50 seconds without any additional chemicals at 25-30° C. with a MASTER VIEW developing machine. Alternatively, the lithographic plate can also be loaded for printing directly without washing with tap water. The functional performance is listed in Table 1.

Exemplary Control 1

The substrate, the hydrophilic layer, the photosensitive layer and the protective layer are prepared by the same method as exemplary embodiment 1. The photosensitive solution has the following composition;
  polymer having a chemical structure B1: 1.800
  urethane acrylate oligomer: 0.36
  pentaerythritol triacrylate: 0.684
  sulfonium hexafluorophosphate salt: 0.72
  infrared absorption dye D1: 0.036
  BYK-333: 0.004
  1-methoxy-2-propanol: 32.40

The lithographic plate obtained from this exemplary control can be processed by using KODAK trendsetter thermal CTP platesetter for exposure at 300 mJ/cm², and then loading for printing after washing with tap water for 30~50 seconds without any additional chemicals at 25-30° C. with a MASTER VIEW developing machine. Alternatively, the lithographic plate can also be loaded for printing directly without washing with tap water. The functional performance is listed in Table 1.

Exemplary Control 2

The substrate, the hydrophilic layer, the photosensitive layer and the protective layer are prepared by the same method as exemplary embodiment 1. The photosensitive solution has the following composition;
  polymer having a chemical structure A8: 5.863
  urethane acrylate oligomer: 0.36
  pentaerythritol triacrylate: 0.684
  sulfonium hexafluorophosphate salt: 0.72
  infrared absorption dye D1: 0.036
  BYK-333: 0.004
  1-methoxy-2-propanol: 32.40

The lithographic plate obtained from this exemplary control can be processed by using KODAK trendsetter thermal CTP platesetter for exposure at 200 mJ/cm², and then loading for printing after washing with tap water for 30~50 seconds without any additional chemicals at 25-30° C. with a MASTER VIEW developing machine. Alternatively, the lithographic plate can also be loaded for printing directly without washing with tap water. The functional performance is listed in Table 1.

Exemplary Control 3

The substrate, the hydrophilic layer, and the application of the photosensitive layer are prepared by the same method as exemplary embodiment 1. The photosensitive solution has the following composition;
  polymer having a chemical structure A1: 3.518
  polymer having a chemical structure B1: 0.72
  acrylic oligomer: 0.36
  pentaerythritol triacrylate: 0.684
  sulfonium hexafluorophosphate salt: 0.72
  infrared absorption dye D1: 0.036
  BYK-333: 0.004
  1-methoxy-2-propanol: 32.40

The lithographic plate obtained from this exemplary control can be processed by using KODAK trendsetter thermal CTP platesetter for exposure at 300 mJ/cm², and then loading for printing after washing with tap water for 30~50 seconds without any additional chemicals at 25-30° C. with a MASTER VIEW developing machine. Alternatively, the lithographic plate can also be loaded for printing directly without washing with tap water. The functional performance is listed in Table 1.

Exemplary Control 4

The substrate, the hydrophilic layer, and the application of the photosensitive layer are prepared by the same method as exemplary embodiment 1. The photosensitive solution has the following composition;
  polymer having a chemical structure A1: 3.518
  polymer having a chemical structure B1: 0.72
  urethane acrylate oligomer: 0.36
  methyl methacrylate: 0.684
  sulfonium hexafluorophosphate salt: 0.72
  infrared absorption dye D1: 0.036
  BYK-333: 0.004
  1-methoxy-2-propanol: 32.40

The lithographic plate obtained from this exemplary control can be processed by using KODAK trendsetter thermal CTP platesetter for exposure at 200 mJ/cm², and
  then loading for printing after washing with tap water for 30~50 seconds without any additional chemicals at 25-30° C. with a MASTER VIEW developing machine. Alternatively, the lithographic plate can also be loaded for printing directly without washing with tap water. The functional performance is listed in Table 1.

Exemplary Control 5

The substrate, the hydrophilic layer, and the application of the photosensitive layer are prepared by the same method as exemplary embodiment 1. The photosensitive solution has the following composition;
  polymer having a chemical structure A1: 3.518
  polymer having a chemical structure B1: 0.72
  urethane acrylate oligomer: 0.36
  pentaerythritol triacrylate: 0.684
  triazine B: 0.72
  infrared absorption dye D1: 0.036
  BYK-333: 0.004
  1-methoxy-2-propanol: 32.40

The lithographic plate obtained from this exemplary control can be processed by using KODAK trendsetter thermal CTP platesetter for exposure at 300 mJ/cm², and then loading for printing after washing with tap water for 30~50 seconds without any additional chemicals at 25-30° C. with a MASTER VIEW developing machine. Alternatively, the lithographic plate can also be loaded for printing directly without washing with tap water. The functional performance is listed in Table 1.

Exemplary Control 6

The substrate, the hydrophilic layer and the photosensitive layer are prepared by the same method as exemplary embodiment 1. The photosensitive solution has the following composition;
polymer having a chemical structure A1: 3.518
polymer having a chemical structure B1: 0.72
urethane acrylate oligomer: 0.36
pentaerythritol triacrylate: 0.684
sulfonium hexafluorophosphate salt: 0.72
infrared absorption dye D2: 0.036
BYK-333: 0.004
1-methoxy-2-propanol: 32.40

The infrared absorption dye D2 has the following chemical structure:

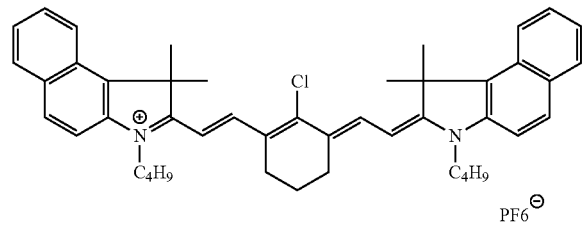

The lithographic plate obtained from this exemplary control can be processed by using KODAK trendsetter thermal CTP platesetter for exposure at 120 mJ/cm$^2$, and then loading for printing after washing with tap water for 30~50 seconds without any additional chemicals at 25-30° C. with a MASTER VIEW developing machine. Alternatively, the lithographic plate can also be loaded for printing directly without washing with tap water. The functional performance is listed in Table 1.

Exemplary Control 7

The substrate, the hydrophilic layer, the photosensitive layer and the protective layer are prepared by the same method as exemplary embodiment 1 except that the average roughness of the centerline of the substrate is 0.70 μm.

The lithographic plate obtained from this exemplary control can be processed by using KODAK trendsetter thermal CTP platesetter for exposure at 120 mJ/cm$^2$, and then loading for printing after washing with tap water for 30~50 seconds without any additional chemicals at 25-30° C. with a MASTER VIEW developing machine. Alternatively, the lithographic plate can also be loaded for printing directly without washing with tap water. The functional performance is listed in Table 1.

Exemplary Control 8

The substrate, the hydrophilic layer, the photosensitive layer and the protective layer are prepared by the same method as exemplary embodiment 1 except that the dry weight of the hydrophilic layer is 10 mg/dm$^2$.

The lithographic plate obtained from this exemplary control can be processed by using KODAK trendsetter thermal CTP platesetter for exposure at 120 mJ/cm$^2$, and then loading for printing after washing with tap water for 30~50 seconds without any additional chemicals at 25-30° C. with a MASTER VIEW developing machine. Alternatively, the lithographic plate can also be loaded for printing directly without washing with tap water. The functional performance is listed in Table 1.

Exemplary Control 9

The substrate, the hydrophilic layer, the photosensitive layer and the protective layer are prepared by the same method as exemplary embodiment 1 except that the dry weight of the protective layer is 25 mg/dm$^2$.

The lithographic plate obtained from this exemplary control can be processed by using KODAK trendsetter thermal CTP platesetter for exposure at 120 mJ/cm$^2$, and then loading for printing after washing with tap water for 30~50 seconds without any additional chemicals at 25-30° C. with a MASTER VIEW developing machine. Alternatively, the lithographic plate can also be loaded for printing directly without washing with tap water. The functional performance is listed in Table 1.

TABLE 1

| Examples | Performance | | | |
|---|---|---|---|---|
| | Exposure Energy (mj/cm$^2$) | Background Condition | Dot reproduction (%) | Run length (×10$^4$) |
| Exemplary Embodiment 1 | 120 | Clean | 1~98 | >8 |
| Exemplary Embodiment 2 | 100 | Clean | 1~98 | >8 |
| Exemplary Embodiment 3 | 140 | Clean | 1~98 | >8 |
| Exemplary Embodiment 4 | 90 | Clean | 1~98 | >8 |
| Exemplary Embodiment 5 | 130 | Clean | 1~98 | >8 |
| Exemplary Embodiment 6 | 120 | Clean | 1~98 | >8 |
| Exemplary Embodiment 7 | 120 | Clean | 1~98 | >8 |
| Exemplary Embodiment 8 | 120 | Clean | 1~98 | >8 |
| Exemplary Embodiment 9 | 120 | Clean | 1~98 | >8 |
| Exemplary Embodiment 10 | 120 | Clean | 1~98 | >8 |
| Exemplary Embodiment 11 | 120 | Clean | 1~98 | >8 |
| Exemplary Embodiment 12 | 120 | Clean | 1~98 | >8 |
| Exemplary Embodiment 13 | 120 | Clean | 1~98 | >8 |
| Exemplary Embodiment 14 | 100 | Clean | 1~98 | >8 |
| Exemplary Control 1 | 300 | Clean | 5~90 | 2 |
| Exemplary Control 2 | 200 | Not Clean | 3~90 | 6 |
| Exemplary Control 3 | 300 | Clean | 5~90 | 3 |
| Exemplary Control 4 | 200 | Clean | 5~90 | 4 |
| Exemplary Control 5 | 300 | Clean | 3~98 | 2 |
| Exemplary Control 6 | 120 | Not Clean | 2~90 | 6 |
| Exemplary Control 7 | 120 | Clean | 5~95 | 5 |
| Exemplary Control 8 | 120 | Clean | 5~98 | 4 |
| Exemplary Control 9 | 120 | Not Clean | 3~90 | 8 |

One skilled in the art will understand that the embodiment of the present invention as shown in the drawings and described above is exemplary only and not intended to be limiting. It will thus be seen that the objects of the present invention have been fully and effectively accomplished. It embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. An infrared sensitive photosensitive composition, comprising a composition which comprises by percentage weight:
   30-70% of a water soluble thermal cross-linking resin;
   1-20% of a water soluble photo cross-linking or polymeric resin;
   10-50% of a photopolymerizable oligomer;
   1-30% of a multifunctional monomer;
   1-20% of a cationic photopolymerization initiator; and
   1-20% of an infrared irradiation absorption dye;
   wherein said water soluble thermal cross-linking resin is urethanized and unsaturated vinyl multi-component co-polymer A having a chemical structure of:

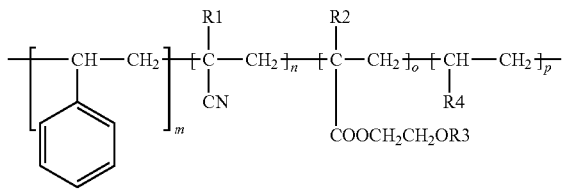

where R1 and R2 are hydrogen or methyl, R3 is $CH_2=C(CH_3)COOCH_2CH_2NCO$-group, R4 is amide group, polyethoxylated ether group or pyrrolidone; m, n, o, p is number of mole of co-polymer unit; a proportion of m is 40~70%, a proportion of n is 10~30%, a proportion of o is 10~30%, and a proportion of p is 10~30%.

2. An infrared sensitive photosensitive composition, comprising a composition which comprises by percentage weight:
   40-60% of said water soluble thermal cross-linking resin;
   5-10% of said water soluble photo cross-linking or polymeric resin;
   20-40% of said photopolymerizable oligomer;
   10-20% of said multifunctional monomer;
   5-15% of said cationic photopolymerization initiator; and
   5-15% of said infrared irradiation absorption dye;
   wherein said water soluble thermal cross-linking resin is urethanized and unsaturated vinyl multi-component co-polymer A having a chemical structure of:

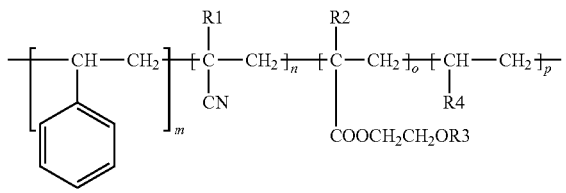

where R1 and R2 are hydrogen or methyl, R3 is $CH_2=C(CH_3)COOCH_2CH_2NCO$-group, R4 is amide group, polyethoxylated ether group or pyrrolidone; m, n, o, p is number of mole of co-polymer unit; a proportion of m is 40~70%, a proportion of n is 10~30%, a proportion of o is 10~30%, and a proportion of p is 10~30%.

3. The infrared sensitive photosensitive composition, as recited in claim 1, wherein said water soluble photo cross-linking or polymeric resin is sulfonic acid group containing unsaturated and water soluble co-polymer A having a chemical structure of:

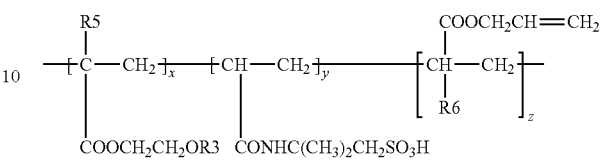

where R3 is $CH_2=C(CH_3)COOCH_2CH_2NCO$-group and R5 and R6 are hydrogen or methyl, x, y, z is number of mole of co-polymer unit; a proportion of x is 20~40%, a proportion of y is 10~30%, and a proportion of z is 30~50%.

4. The infrared sensitive photosensitive composition, as recited in claim 2, wherein said water soluble photo cross-linking or polymeric resin is sulfonic acid group containing unsaturated and water soluble co-polymer A having a chemical structure of:

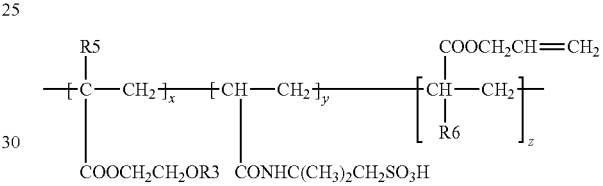

where R3 is $CH_2=C(CH_3)COOCH_2CH_2NCO$-group and R5 and R6 are hydrogen or methyl, x, y, z is number of mole of co-polymer unit; a proportion of x is 20~40%, a proportion of y is 10~30%, and a proportion of z is 30~50%.

5. The infrared sensitive photosensitive composition, as recited in claim 1, wherein said photopolymerizable oligomer is polyurethane acrylic oligomer.

6. The infrared sensitive photosensitive composition, as recited in claim 2, wherein said photopolymerizable oligomer is polyurethane acrylic oligomer.

7. The infrared sensitive photosensitive composition, as recited in claim 1, wherein said multifunctional monomer is selected from a group consisting of acrylic monomer, polyurethane acrylic monomer and epoxy acrylate monomer.

8. The infrared sensitive photosensitive composition, as recited in claim 2, wherein said multifunctional monomer is selected from a group consisting of acrylic monomer, polyurethane acrylic monomer and epoxy acrylate monomer.

9. The infrared sensitive photosensitive composition, as recited in claim 1, wherein said cationic photopolymerization initiator is selected from one or more of a group consisting of iodonium salt, sulfur salt, phosphorus salt and selenium salt.

10. The infrared sensitive photosensitive composition, as recited in claim 2, wherein said cationic photopolymerization initiator is selected from one or more of a group consisting of iodonium salt, sulfur salt, phosphorus salt and selenium salt.

11. The infrared sensitive photosensitive composition, as recited in claim 1, wherein a thermal decomposition temperature of said cationic photopolymerization initiator is 150~200° C.

12. The infrared sensitive photosensitive composition, as recited in claim 2, wherein a thermal decomposition temperature of said cationic photopolymerization initiator is 150~200° C.

13. The infrared sensitive photosensitive composition, as recited in claim 1, wherein said infrared irradiation absorption dye is a water soluble cyanine dye having an absorption range of 750~850 nm.

14. The infrared sensitive photosensitive composition, as recited in claim 2, wherein said infrared irradiation absorption dye is a water soluble cyanine dye having an absorption range of 750~850 nm.

15. A lithographic plate with Infrared sensitive photosensitive composition according to claim 1, comprising: (1) an aluminum substrate support unit; (2) a hydrophilic layer containing an unsaturated and water soluble co-polymer B provided on said aluminum substrate support unit; (3) a coating layer of said infrared sensitive photosensitive composition on top of said hydrophilic layer provided on the same side of said hydrophilic layer on said aluminum substrate support unit; and (4) a protective layer on top of said coating layer of said chemical treatment free and infrared sensitive photosensitive composition provided on the same side of said hydrophilic layer on said aluminum substrate support unit.

16. A lithographic plate with Infrared sensitive photosensitive composition according to claim 2, comprising: (1) an aluminum substrate support unit; (2) a hydrophilic layer containing an unsaturated and water soluble co-polymer B provided on said aluminum substrate support unit; (3) a coating layer of said infrared sensitive photosensitive composition on top of said hydrophilic layer provided on the same side of said hydrophilic layer on said aluminum substrate support unit; and (4) a protective layer on top of said coating layer of said chemical treatment free and infrared sensitive photosensitive composition provided on the same side of said hydrophilic layer on said aluminum substrate support unit.

17. The lithographic plate with Infrared sensitive photosensitive composition, as recited in claim 15, wherein said aluminum substrate support unit is an aluminum substrate which is first processed by electrolytic roughening and anodizing and then followed by sealing treatment, wherein an average of a centerline roughness is 0.4-0.6 μm.

18. The lithographic plate with Infrared sensitive photosensitive composition, as recited in claim 16, wherein said aluminum substrate support unit is an aluminum substrate which is first processed by electrolytic roughening and anodizing and then followed by sealing treatment, wherein an average of a centerline roughness is 0.4-0.6 μm.

19. The lithographic plate with Infrared sensitive photosensitive composition, as recited in claim 15, wherein a dry weight of said hydrophilic layer is 0.5-10 mg/dm$^2$, a dry weight of said coating layer of Infrared sensitive photosensitive composition is 8-15 mg/dm$^2$, and a dry weight of said protective layer is 5-20 mg/dm$^2$.

20. The lithographic plate with Infrared sensitive photosensitive composition, as recited in claim 16, wherein a dry weight of said hydrophilic layer is 0.5-10 mg/dm$^2$, a dry weight of said coating layer of Infrared sensitive photosensitive composition is 8-15 mg/dm$^2$, and a dry weight of said protective layer is 5-20 mg/dm$^2$.

21. The lithographic plate with Infrared sensitive photosensitive composition, as recited in claim 15, wherein said lithographic plate is processed by scanning and exposure with a thermal CTP platesetter so as to eliminate the need of development by using developer and allow utilization of tap water at 15-30° C. for washing to obtain a printable lithographic plate.

22. The lithographic plate with Infrared sensitive photosensitive composition, as recited in claim 16, wherein said lithographic plate is processed by scanning and exposure with a thermal CTP platesetter so as to eliminate the need of development by using developer and allow utilization of tap water at 15-30° C. for washing to obtain a printable lithographic plate.

23. The lithographic plate with Infrared sensitive photosensitive composition, as recited in claim 15, wherein said lithographic plate is processed by scanning and exposure with a thermal CTP platesetter and can be put on press for printing directly without any photographic processing steps.

24. The lithographic plate with Infrared sensitive photosensitive composition, as recited in claim 16, wherein said lithographic plate is processed by scanning and exposure with a thermal CTP platesetter and can be put on press for printing directly without any photographic processing steps.

* * * * *